(12) United States Patent
Chretien et al.

(10) Patent No.: US 8,947,034 B2
(45) Date of Patent: Feb. 3, 2015

(54) METHODS AND SYSTEMS FOR CONTROLLING AN ELECTRIC MOTOR

(71) Applicant: Regal Beloit America, Inc., Beloit, WI (US)

(72) Inventors: Ludovic Andre Chretien, Columbia City, IN (US); Brian L. Beifus, Fort Wayne, IN (US); Michael R. Koller, Columbia City, IN (US); Norman C. Golm, Jr., Fort Wayne, IN (US); Gregory P. Sullivan, Fort Wayne, IN (US)

(73) Assignee: Regal Beloit America, Inc., Beloit, WI (US)

( * ) Notice: Subject to any disclaimer, the term of this patent is extended or adjusted under 35 U.S.C. 154(b) by 139 days.

(21) Appl. No.: 13/829,121

(22) Filed: Mar. 14, 2013

(65) Prior Publication Data

US 2014/0265990 A1 Sep. 18, 2014

(51) Int. Cl.
*H02P 31/00* (2006.01)
(52) U.S. Cl.
CPC ...................... *H02P 31/00* (2013.01)
USPC .............................. 318/558; 318/34; 318/700

(58) Field of Classification Search
CPC ........................................................ H02P 31/00
USPC ............................................ 318/558, 700, 34
See application file for complete search history.

(56) References Cited

U.S. PATENT DOCUMENTS

| 7,039,542 B2 * | 5/2006 | Fujii et al. ..................... 702/115 |
| 2010/0251510 A1 | 10/2010 | Clothier et al. |
| 2010/0251511 A1 | 10/2010 | Clothier et al. |
| 2010/0253265 A1 | 10/2010 | Clothier et al. |
| 2012/0265390 A1 | 10/2012 | Hauser et al. |

* cited by examiner

*Primary Examiner* — David S Luo

(57) ABSTRACT

A system and a method of automatically determining an electric motor type are provided. An electric motor drive controller is configured to be coupled to an electric motor and to determine running parameters of the drive controller for the electric motor. The drive controller includes a memory device, a processor communicatively coupled to the memory device and to a user interface wherein the processor is configured to execute instructions stored on the memory device that cause the processor to automatically measure electrical characteristics of the electric motor, identify the electric motor using the measured electrical characteristics, load pre defined running parameters selected based on the identification into the memory device, and control an operation of the electric motor using the controller and the loaded running parameters.

21 Claims, 3 Drawing Sheets

METHODS AND SYSTEMS FOR CONTROLLING AN ELECTRIC MOTOR

BACKGROUND OF THE DISCLOSURE

The field of the invention relates generally to electric motors, and more specifically, to methods and systems for operating electric motors.

Typical electric motor systems include a motor controller and an electric motor. The motor controller receives power from an alternating current (AC) or direct current (DC) power supply, and applies it to a rectifier and, in some controllers, to capacitors to generate a smoothed direct current (DC) voltage. The motor controller then supplies a chopped DC voltage to the electric motor through an inverter, which uses the power to drive a load.

Many motor and controllers are matched to each other using hardware or software settings to improve performance of the motor. Over time, the motors may need to be replaced and an exact replacement may not be available to replace the original motor. In such cases, the motor characteristics must be identified and the settings of the controller or the hardware in the controller must be manually updated to accommodate the motor characteristics. Measuring the motor characteristics and revising the settings or hardware is time-consuming and may be laborious. Moreover, the possibility of inputting erroneous running parameter settings may cause inefficient operation of the motor.

BRIEF DESCRIPTION OF THE INVENTION

In one embodiment, an electric motor drive controller is configured to be coupled to an electric motor and to determine running parameters of the drive controller for the electric motor. The drive controller includes a memory device, a processor communicatively coupled to the memory device and to a user interface wherein the processor is configured to execute instructions stored on the memory device that cause the processor to automatically measure electrical characteristics of the electric motor, identify the electric motor using the measured electrical characteristics, load pre defined running parameters selected based on the identification into the memory device, and control an operation of the electric motor using the controller and the loaded running parameters.

In another embodiment, a method of determining an electric motor type includes measuring electrical characteristics of an electric motor, identifying the electric motor using the measured electrical characteristics, loading pre-defined running parameters into a controller electrically coupled to the electric motor and configured to drive the electric motor wherein the running parameters are based on the identification, and controlling an operation of the electric motor using the controller and the loaded pre-defined running parameters.

In yet another embodiment, an air moving system includes an electric motor, a load coupled to the electric motor, and a controller coupled to the electric motor wherein the controller is configured to automatically measure electrical characteristics of the electric motor, identify the electric motor using the measured electrical characteristics, loading pre-defined running parameters selected based on the identification into the memory device, and control an operation of the electric motor using the controller and the loaded running parameters.

BRIEF DESCRIPTION OF THE DRAWINGS

FIG. 1 is a functional diagram of a motor drive that may be used for operating an electric motor.

FIG. 2 is a screen capture of a two-phase current inside the motor in accordance with an exemplary embodiment of the present disclosure.

FIG. 3 is a simulation of an axial view of a motor with a rotor locked in a first position.

FIG. 4 is the simulation of the axial view shown in FIG. 3 with the rotor locked in the second position.

FIG. 5 is flow chart of a method of identifying a type of motor automatically using the motor drive shown in FIG. 1.

Figure 1:
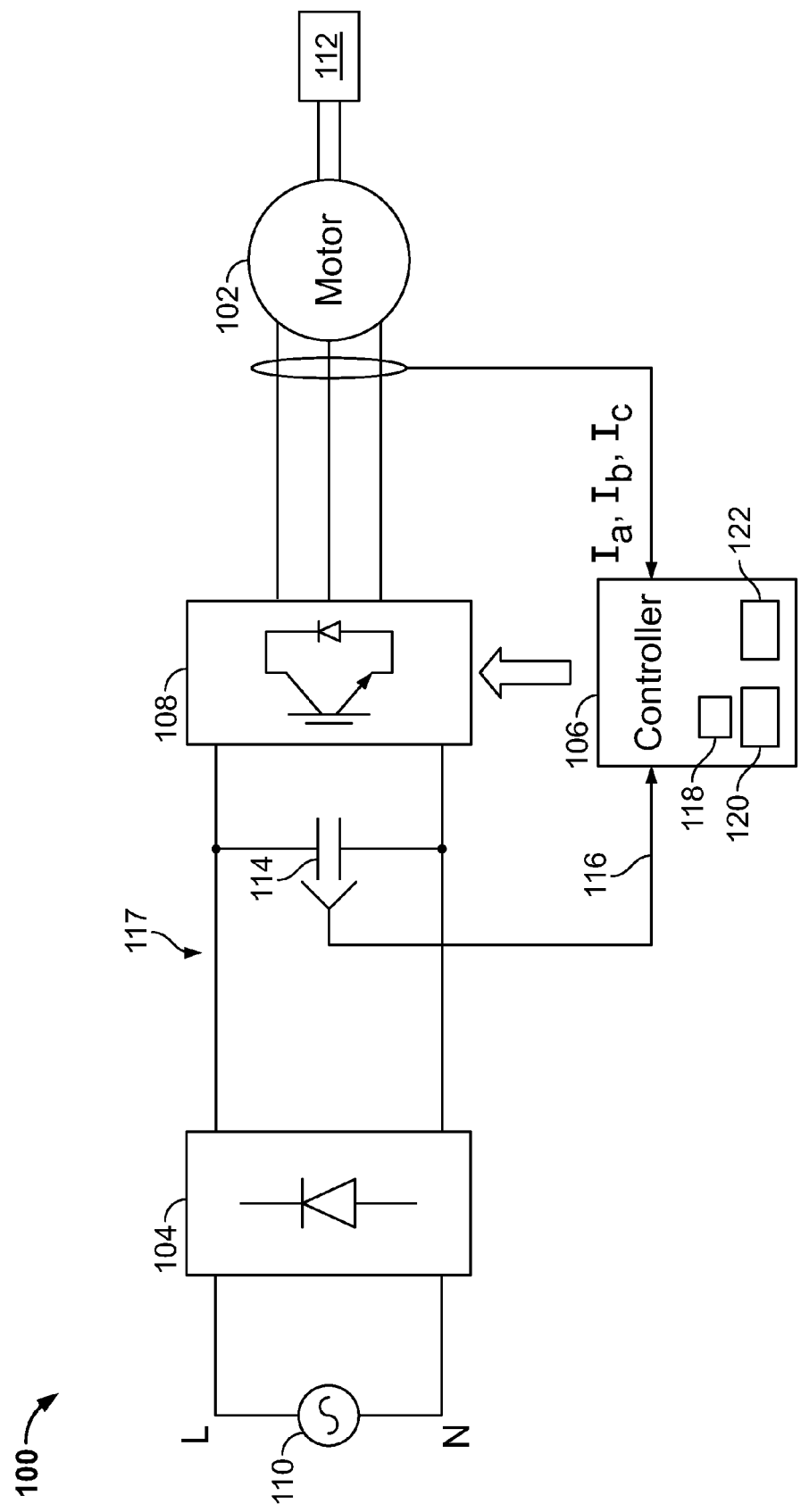
FIGS. 1-5 show exemplary embodiments of the method and system described herein.

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION OF THE INVENTION

The following detailed description illustrates embodiments of the invention by way of example and not by way of limitation. It is contemplated that the invention has general application to analytical and methodical embodiments of determining motor operating characteristics and controlling motor operation in industrial, commercial, and residential applications.

Embodiments of motors and motor drive controllers described herein are able to identify which motor type the electronic motor drive controller is connected to by measuring machine characteristics and load predefined running parameters associated with the measured characteristics.

To efficiently run sensorless permanent magnet synchronous motors (PMSM), it may be necessary to have some information about the motor such as number of poles, resistance, inductance, back EMF and torque constant to drive the machine in an optimum manner. As used herein, a PMSM is an AC synchronous motor whose field excitation is provided by permanent magnets. PMSMs are sized for different applications and the different sizes may have a different number of poles, different internal structures, and different winding impedance. When replacing only the electronic control to a motor already in the field or when replacing a motor and not the controller, it is necessary to know the motor information so the controller operation can be matched to the motor.

In the past, replacement controllers were matched to a unique motor topology and were pre-programmed accordingly. Also, some drives have the capability to measure motor parameters to auto tune. However, the auto-tuning cannot find the number of pole pairs, or acceptable maximum and minimum torque, currents, speeds. To be able to load the correct running parameters, the motor type or model needs to be determined. With the motor type known, the running parameters can be determined, for example, from a lookup table of values.

In various embodiments, the topology of an electric motor is determined in real time from measuring electrical characteristics of the motor. Then the whole set of parameters to run the motor, for example, a number of poles, a maximum current, and control loop parameters are loaded from memory, such as, from a lookup table.

The following description refers to the accompanying drawings, in which, in the absence of a contrary representation, the same numbers in different drawings represent similar elements.

FIG. 1 is a functional diagram of a motor drive 100 that may be used for operating an electric motor 102. In the exemplary embodiment, motor drive 100 includes a rectifier 104, a controller 106, and an inverter 108. Motor drive 100 is coupled to a power supply 110 for receiving input power to drive electric motor 102. Electric motor 102 is coupled to and drives a load 112.

In the exemplary embodiment, power supply 110 supplies a single-phase alternating current (AC) voltage to motor drive 100. However, power supply 110 may supply three-phase AC, or any other type of input voltage that enables motor drive 100 to function as described herein. Rectifier 104 receives an AC input voltage from a power supply 110 and rectifies it to produce a pulsed DC voltage. Inverter 108 conditions the pulsed DC voltage, and supplies it to electric motor 102, which uses the power to drive load 112. In the exemplary embodiment, inverter 108 converts the pulsed DC voltage to a three-phase AC voltage. Alternatively, inverter 108 converts the pulsed DC voltage to any type of voltage that enables motor controller to function as described herein.

In some embodiments, motor drive 100 includes a capacitor 114 for storing energy when input voltage is available and to smooth the ripple of the pulsed DC-link voltage. In some embodiments, capacitor 114 is configured to filter out switching frequency harmonics of electric motor 102. In other embodiments, capacitor 114 reduces inrush input current to electric motor 102. Further, capacitor 114 facilitates motor drive 100 increasing line input power factor.

Motor drive 100 also includes a method of sensing DC link voltage, such as, but not limited to, through a voltage divider or a voltage sensor 116 coupled across capacitor 114. The method of voltage sensing is configured to measure a voltage of a DC link 117 downstream of rectifier 104. The method of voltage sensing provides the DC link voltage measurement to controller 106 for use in controlling electric motor 102. Controller 106 includes a processor 118, a memory device 120 and a user interface 122 communicatively coupled to processor 118.

Figure 2:
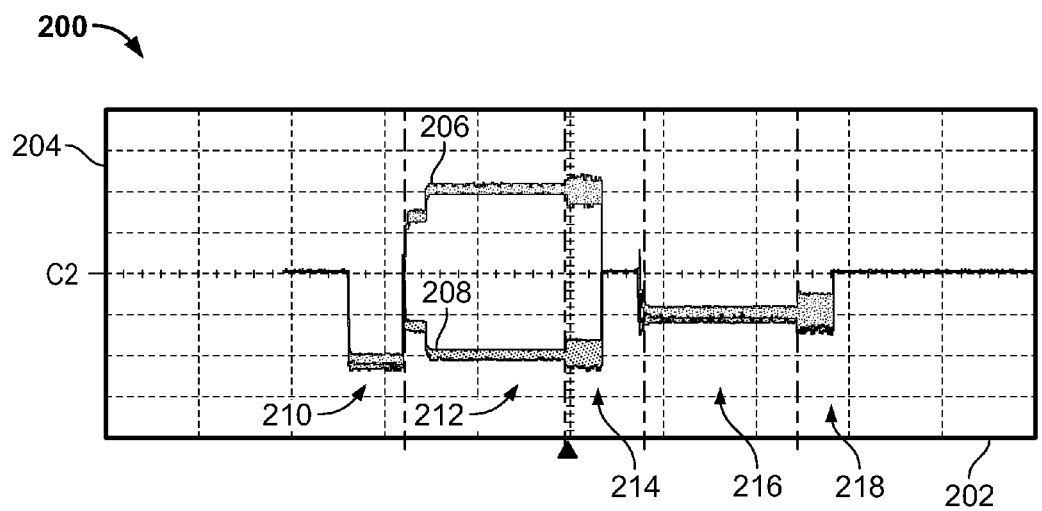

FIG. 2 is a screen capture 200 of a two-phase current inside the motor. Screen capture 200 shows a sequence of signals injected into the winding of a permanent magnet synchronous motor (PMSM) in accordance with an exemplary embodiment of the present disclosure. In the exemplary embodiment, graph 200 includes an x-axis 202 graduated in units of time and a y-axis 204 graduated in units of current. Graph 200 includes a first trace 206 of a current resulting from applying a voltage to a first phase winding and a second trace 208 of a current resulting from applying a voltage to a second phase winding. The resistance is determined using, $R=V_{applied}/I_{measured}$, where R is the resistance, $V_{applied}$ is the voltage applied to the winding, and $I_{measured}$ is the measured current in the winding. The resistance is one of the motor measured characteristics that will facilitate identifying the motor. A current reading for the resistance determination is shown in region 210 of graph 200. The inductance of the windings depends on motor topology, including a position of the rotor when the measurement is taken. The rotor is locked in a first position shown by region 212 to take a d-axis inductance measurement, $L_d$ shown in region 214. The rotor is locked in a second position shown by region 216 to take a q-axis inductance measurement, $L_q$ shown in region 218.

Figure 3:
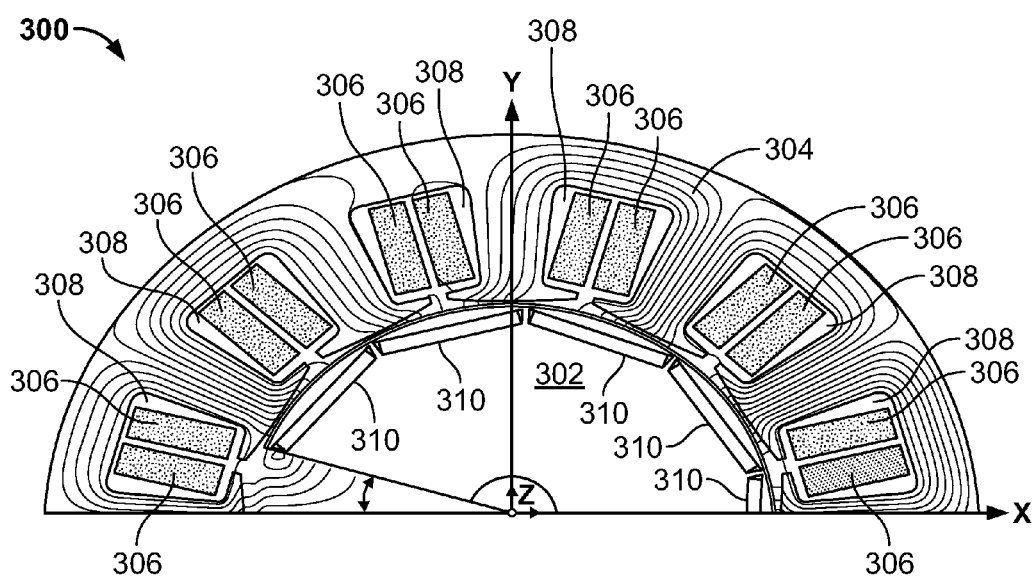

FIG. 3 is a simulation of an axial view 300 of a motor with a rotor 302 locked in the first position. A stator core 304 includes windings 306 positioned in grooves 308 formed in stator core 304. Rotor 302 includes rotor magnets 310 embedded in rotor 302. The relative positions of stator core 304 and rotor 302 in the first position permits measuring the inductance of the motor in the d-axis, which is shown in region 214 (shown in FIG. 2).

Figure 4:
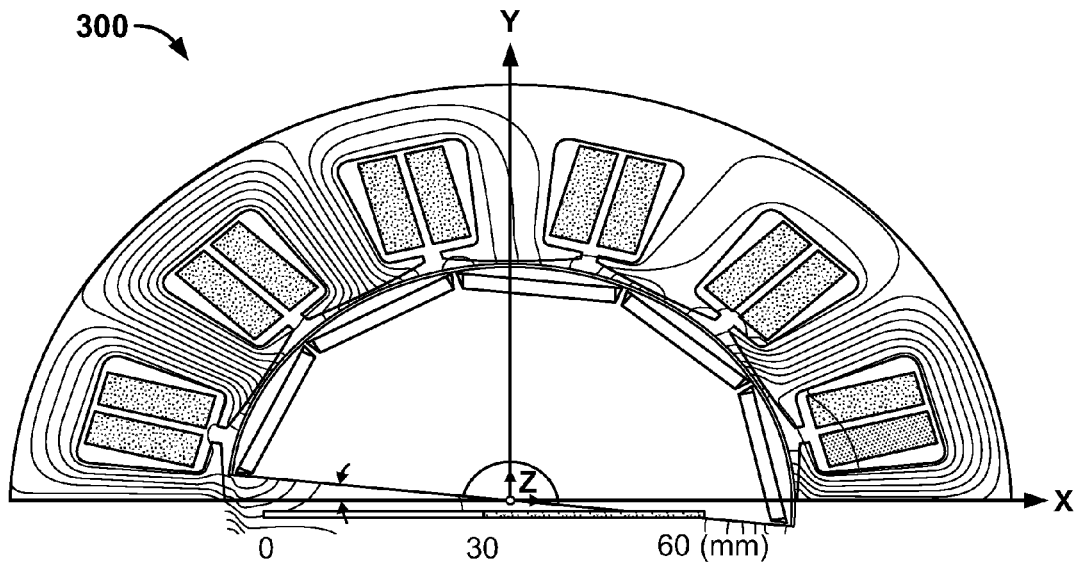

FIG. 4 is the simulation of axial view 300 with rotor 302 locked in the second position. The relative positions of stator core 304 and rotor 302 in the second position permits measuring the inductance of the motor in the q-axis, which is shown in region 218 (shown in FIG. 2).

The inductance of the motor in the d-axis, $L_d$ and the inductance of the motor is the q-axis, $L_q$ are determined by the applied sequence of voltage pulses and the resulting measured current according to the equation:

$$V^* = R_{est}\hat{I} + L_{dq}d\hat{I}/dt,$$

V* represents the applied voltage,
$R_{est}$ represents the winding resistance,
$\hat{I}$ represented the measured current,
$L_{dq}$ represents the motor inductance,
dI/dt represents the change of the measured current with respect to time.

Once the $L_d$ and $L_q$ inductances are known, they can be used along with the winding resistance value to further identify the motor type that is connected to motor drive 100.

Figure 5:
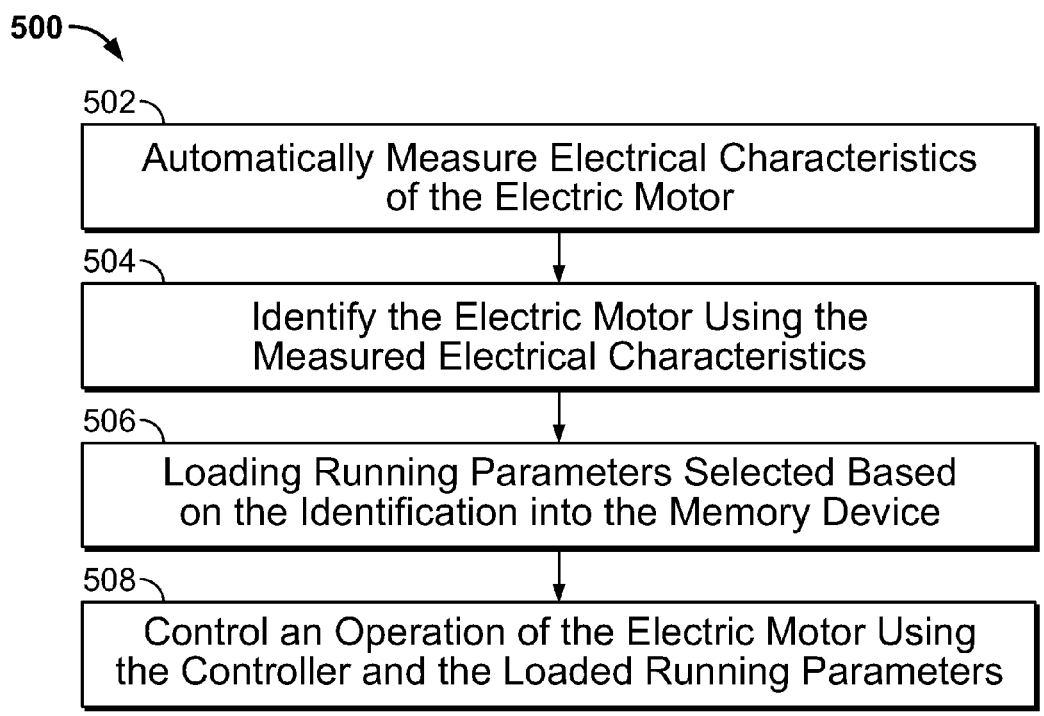

FIG. 5 is flow chart of a method 500 of identifying a type of motor 102 automatically using motor drive 100 (shown in FIG. 1). In the exemplary embodiment, method 500 includes measuring 502 electrical characteristics of motor 102, identifying 504 the electric motor using the measured electrical characteristics, loading 506 running parameters into motor drive 100 electrically coupled to the electric motor and configured to drive the electric motor, the running parameters based on the identification, and controlling 508 an operation of the electric motor using the controller and the loaded running parameters. The electrical characteristics may be measured automatically from motor drive 100 by injecting a sequence of signals into the electric motor windings, the sequence including a first DC signal and an AC signal superimposed onto a second DC signal. A phase resistance of a winding of motor drive 100 is measured using the DC signal injected into the winding. A direct-axis (d-axis) phase inductance and/or a quadrature-axis (q-axis) phase inductance of the winding may be measured using an AC signal superimposed onto a DC signal and injected into the winding. The resistance value, inductance values or combinations thereof are then compared to known corresponding values for a plurality of known motors seeking a match or eliminating motors with values that exceed a tolerance range. For example, any of the following may be used to decide the identity or type of motor 102: R, $L_d$, $L_q$, $L_q/L_d$, $L_d/L_q$, $L_d-L_q$, $L_q-L_d$, $L_q/R$, or $L_d/R$. From the comparison, a likely candidate motor type or model is identified and a topology of motor 102 is determined based on the identification. Using the motor identification, a look-up of motor running parameters is performed and the running parameters are loaded into a memory of motor drive 100 and are used to control the operation of motor 102.

To acquire the measurements of resistance and inductance the motor should be at steady state for the position. That the motor is at steady state for the position is determined by motor drive 100 using a comparison of the motor current and an applied voltage to detect oscillations in the motor current. If there are oscillations, the motor is not at steady state position and the measurements are delayed for a predetermined time period.

When measuring the electrical characteristics of the motor, the measurements may be taken using successive readings at different values of motor current and using the successive readings to identify a saturation point of a core of the motor based on the measured successive readings. Such saturation point may permit accurate measurements by not allowing measurements to be taken using a current that is high enough to saturate the core.

The determination of running parameters may be done at various moments in time. The results can be stored in volatile or non-volatile memory to enable statistical analysis of the evolution of the parameters and detect changes in the motor drive system. For example, it may be advantageous to determine the running parameters at every starting of the motor, at every power up of the motor 102/motor drive 100 system, at each of a first predetermined number times the system is powered up, when commanded by a combination of drive inputs or a serial input command, or following a reprogramming of motor drive 100.

Occasionally, it may be desirable to reset a decision of the algorithms such that the algorithms execute again to determine the motor type and then the motor running parameters. A reset may be initiated when commanded by a combination of drive inputs or a serial input command, or following a reprogramming of motor drive 100. Further, motor drive 100 may output a signal indicating the running parameters are loaded, for example, the signal may include a sound induced in a core of motor 102 using a high frequency motor current, an audible tone from motor drive 100, and a visual indication from motor drive 100.

FIG. 5 is an example only and not intended to be restrictive. Other data flows may therefore occur in drive controller and, even with the data flow 200, the illustrated events and their particular order in time may vary. Further, the illustrated events may overlap and/or may exist in fewer steps. Moreover, certain events may not be present and additional and/or different events may be included.

The foregoing detailed description illustrates embodiments of the invention by way of example and not by way of limitation. It is contemplated that the invention has general application to the motor drive operation. It is further contemplated that the methods and systems described herein may be incorporated into existing motor drive systems, such as through a software, firmware, and/or hardware update, in addition to being maintained as a separate stand-alone application.

As will be appreciated based on the foregoing specification, the above-described embodiments of the disclosure may be implemented using computer programming or engineering techniques including computer software, firmware, hardware or any combination or subset thereof, wherein the technical effect includes at least one of (a) automatically measuring electrical characteristics of the electric motor, (b) identifying the electric motor using the measured electrical characteristics, (c) loading running parameters selected based on the identification into the memory device, and (d) controlling an operation of the electric motor using the controller and the loaded running parameters.

Thus, various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications, modules, or code) include machine instructions for a programmable processor, and can be implemented in a high-level procedural and/or object-oriented programming language, and/or in assembly/machine language.

The logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It will be appreciated that the above embodiments that have been described in particular detail are merely example or possible embodiments, and that there are many other combinations, additions, or alternatives that may be included.

Also, the particular naming of the components, capitalization of terms, the attributes, data structures, or any other programming or structural aspect is not mandatory or significant, and the mechanisms that implement the invention or its features may have different names, formats, or protocols. Further, the system may be implemented via a combination of hardware and software, as described, or entirely in hardware elements. Also, the particular division of functionality between the various system components described herein is merely one example, and not mandatory; functions performed by a single system component may instead be performed by multiple components, and functions performed by multiple components may instead performed by a single component.

Some portions of above description present features in terms of algorithms and symbolic representations of operations on information. These algorithmic descriptions and representations may be used by those skilled in the data processing arts to most effectively convey the substance of their work to others skilled in the art. These operations, while described functionally or logically, are understood to be implemented by computer programs. Furthermore, it has also proven convenient at times, to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or "providing" or the like, refer to the action and processes of a computer system, or similar electronic computing device, that manipulates and transforms data represented as physical (electronic) quantities within the computer system memories or registers or other such information storage, transmission or display devices.

Based on the foregoing specification, the above-discussed embodiments of the invention may be implemented using computer programming or engineering techniques including computer software, firmware, hardware or any combination or subset thereof.

While the disclosure has been described in terms of various specific embodiments, it will be recognized that the disclosure can be practiced with modification within the spirit and scope of the claims.

The term processor, as used herein, refers to central processing units, microprocessors, microcontrollers, reduced instruction set circuits (RISC), application specific integrated circuits (ASIC), logic circuits, and any other circuit or processor capable of executing the functions described herein.

As used herein, the terms "software" and "firmware" are interchangeable, and include any computer program stored in memory device 120 for execution by processor 118, including RAM memory, ROM memory, EPROM memory, EEPROM memory, and non-volatile RAM (NVRAM) memory. The above memory types are exemplary only, and are thus not limiting as to the types of memory usable for storage of a computer program.

Many of the functional units described in this specification have been labeled as modules, in order to more particularly emphasize their implementation independence. For example, a module may be implemented as a hardware circuit comprising custom very large scale integration ("VLSI") circuits or gate arrays, off-the-shelf semiconductors such as logic chips, transistors, or other discrete components. A module may also be implemented in programmable hardware devices such as field programmable gate arrays (FPGAs), programmable array logic, programmable logic devices (PLDs) or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The above-described embodiments of a method and system of determining a motor type and running parameters for the motor provides a cost-effective and reliable means for automatically providing running parameters to the drive controller. More specifically, the methods and systems described herein facilitate operating the motor/drive system in a cost-effective and reliable manner.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electric motor drive controller configured to be coupled to an electric motor, said drive controller configured to determine running parameters of the drive controller for the electric motor, said drive controller comprising:
a memory device;
a processor communicatively coupled to said memory device, said processor configured to execute instructions stored on the memory device cause the processor to:
automatically measure electrical characteristics of the electric motor;
identify the electric motor using the measured electrical characteristics;
load running parameters selected based on the identification into the memory device; and
control an operation of the electric motor using the controller and the loaded running parameters.

2. The drive controller of claim 1, further comprising one or more instruction modules programmed with instructions, the instructions are configured to at least one of:
detect load oscillations of the electric motor using a lock-phase algorithm that monitors a ratio of motor current and applied voltage and oscillations, and
determine a saturation point of the motor using an adaptive algorithm that acquires multiple successive motor winding readings for different values of motor current to identify the saturation point.

3. A method of determining an electric motor type, said method comprising:
measuring electrical characteristics of an electric motor;
identifying the electric motor using the measured electrical characteristics;
loading running parameters into a controller electrically coupled to the electric motor and configured to drive the electric motor, the running parameters based on the identification; and
controlling an operation of the electric motor using the controller and the loaded running parameters.

4. The method of claim 3, wherein measuring electrical characteristics of an electric motor comprises measuring electrical characteristics of an electric motor automatically from the controller.

5. The method of claim 3, wherein measuring electrical characteristics of an electric motor comprises injecting a sequence of signals into the electric motor windings, the sequence including a first DC signal and an AC signal superimposed onto the DC signal.

6. The method of claim 3, wherein measuring electrical characteristics of an electric motor comprises determining a phase resistance of a winding of the electric motor using a DC signal injected into the winding.

7. The method of claim 3, wherein measuring electrical characteristics of an electric motor comprises measuring at least one of a direct-axis (d-axis) phase inductance and a quadrature-axis (q-axis) phase inductance of a winding of the electric motor using an AC signal superimposed onto a DC signal and injected into the winding.

8. The method of claim 3, wherein measuring electrical characteristics of an electric motor comprises determining when the electric motor reaches steady state using a comparison of a motor current and an applied voltage to detect oscillations in the motor current.

9. The method of claim 3, wherein measuring electrical characteristics of an electric motor comprises:
measuring successive readings at different values of motor current; and
identifying a saturation point of the motor based on the measured successive readings.

10. The method of claim 3, wherein identifying the electric motor comprises determining a manufacturer and type of the electric motor based on the identification, if the electric motor is determined to be of a different manufacturer than the controller and the motor type is identified, loading the motor running parameters including a maximum current value and operating points or deciding to prevent system operation.

11. The method of claim 3, wherein identifying the electric motor comprises using at least one of a lookup table and statistical analysis to correlate the measured electrical parameters to one or more running parameters of the electric motor.

12. The method of claim 3, using an adaptive algorithm that makes multiple successive measurements for different values of current and identify the saturation point.

13. The method of claim 3, further comprising determining the electric motor type at least one of at every starting of the motor, at every power up of the system, at each of a first predetermined number times the system is powered up, when commanded by a combination of drive inputs or a serial input command, and following a reprogramming of the controller.

14. The method of claim 3, further comprising periodically determining the running parameters at selectable times wherein the results are stored in a memory of the controller to permit a statistical analysis of a change of the running parameters over time and to detect changes in the motor drive system using the analysis.

15. The method of claim 3, further comprising resetting a decision already made at least one of when commanded by a combination of drive inputs or a serial input command, and following a reprogramming of the controller.

16. The method of claim 3, further comprising outputting a signal indicating the running parameters are loaded, the signal including at least one of a sound induced in a core of the motor using a high frequency motor current, an audible tone from the controller, and a visual indication from the controller.

17. An air moving system comprising:
an electric motor;
a load coupled to said electric motor; and
a controller coupled to said electric motor, said controller configured to:
automatically measure electrical characteristics of the electric motor;
identify the electric motor using the measured electrical characteristics;
load running parameters selected based on the identification into the memory device; and
control an operation of the electric motor using the controller and the loaded running parameters.

18. The system of claim 17, wherein measuring electrical characteristics of an electric motor comprises injecting a sequence of signals into the electric motor windings, the sequence including a first DC signal to determine a phase resistance of a winding of the electric motor and an AC signal superimposed onto a DC signal and injected into the winding to measure at least one of a direct-axis (d-axis) phase inductance and a quadrature-axis (q-axis) phase inductance of a winding of the electric motor.

19. The system of claim 17, wherein said controller is configured to:
measure successive readings at different values of motor current; and
identify a saturation point of the motor based on the measured successive readings.

20. The system of claim 17, wherein said controller is configured to use at least one of a lookup table and statistical analysis to correlate the measured electrical parameters to one or more running parameters of the electric motor.

21. The system of claim 17, wherein said controller is configured to determine the electric motor type at least one of, at every starting of the motor, at every power up of the system, at each of a first predetermined number times the system is powered up, when commanded by a combination of drive inputs or a serial input command, following a reprogramming of the controller.

* * * * *